(12) United States Patent
Schwarz

(10) Patent No.: US 7,292,067 B2
(45) Date of Patent: Nov. 6, 2007

(54) METHOD AND APPARATUS FOR BUFFERING BI-DIRECTIONAL OPEN DRAIN SIGNAL LINES

(75) Inventor: Daniel J. Schwarz, Fort Wayne, IN (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 209 days.

(21) Appl. No.: 11/128,424

(22) Filed: May 13, 2005

(65) Prior Publication Data

US 2006/0267632 A1 Nov. 30, 2006

(51) Int. Cl.
*H03K 19/094* (2006.01)
(52) U.S. Cl. .......................... 326/82; 326/86
(58) Field of Classification Search .................. 326/82, 326/83, 86, 80, 81, 68
See application file for complete search history.

(56) References Cited

U.S. PATENT DOCUMENTS

| | | |
|---|---|---|
| 4,695,740 A | 9/1987 | Carter |
| 4,835,418 A | 5/1989 | Hsieh |
| 4,855,619 A | 8/1989 | Hsieh et al. |
| 5,107,148 A | 4/1992 | Millman |
| 5,214,330 A | 5/1993 | Okazaki |
| 5,420,696 A | 5/1995 | Wegeng et al. |
| 5,486,778 A | 1/1996 | Lou |
| 5,517,135 A | 5/1996 | Young |
| 5,602,495 A | 2/1997 | Lou |
| 5,606,672 A | 2/1997 | Wade |
| 5,627,480 A | 5/1997 | Young et al. |
| 5,656,950 A | 8/1997 | Duong et al. |
| 5,789,972 A | 8/1998 | Lou |

(Continued)

FOREIGN PATENT DOCUMENTS

GB          1551595          8/1979

(Continued)

OTHER PUBLICATIONS

Chow, "Bidirectional Buffer for Mixed Voltage Applications," ISCA '99, Proceedings of the 1999 IEEE International Symposium on Circuits and Systems VLSI, Part 1, pp. 270-273, 1999.

(Continued)

*Primary Examiner*—Rexford Barnie
*Assistant Examiner*—Thienvu Tran
(74) *Attorney, Agent, or Firm*—Edell, Shapiro & Finnan, LLC

(57) ABSTRACT

A buffer system includes a logic adjusting circuit for translating a first logic level of a first component to a second logic level of a second component. The first and second logic level values are substantially different, and the buffer system has no directional control signal. A method of interfacing at least two components with different logic voltage requirements on a single bus without a separate directional control signal includes initializing a buffering circuit, activating the buffering circuit, transferring data through the buffering circuit, and deactivating the buffering circuit. A method of implementing a bi-directional interface between at least two devices interfaced on a bus includes providing a plurality of logic components interconnected to transfer data through the bus, and transferring data through the bus from a first device to a second device. The direction of data transfer is determined without a separate directional control signal.

13 Claims, 4 Drawing Sheets

U.S. PATENT DOCUMENTS

| | | |
|---|---|---|
| 5,790,458 A | 8/1998 | Lee et al. |
| 5,790,526 A | 8/1998 | Kniess et al. |
| 5,808,492 A | 9/1998 | Chow |
| 5,828,854 A | 10/1998 | Wade |
| 5,870,573 A | 2/1999 | Johnson |
| 5,933,614 A | 8/1999 | Tavallaci et al. |
| 5,941,964 A | 8/1999 | Young et al. |
| 6,038,627 A | 3/2000 | Plants |
| 6,046,605 A | 4/2000 | Ziemkowski et al. |
| 6,081,865 A | 6/2000 | Tavallaei et al. |
| 6,243,769 B1 | 6/2001 | Rooney |
| 6,370,593 B1 | 4/2002 | Larson |
| 6,388,467 B1 * | 5/2002 | Ward et al. .................. 326/56 |
| 6,430,637 B1 | 8/2002 | Larson |
| 6,496,887 B1 | 12/2002 | Plants |
| 6,601,118 B1 | 7/2003 | Rooney |
| 6,822,480 B1 * | 11/2004 | McCalmont ................. 326/81 |
| 2003/0043300 A1 | 3/2003 | White |

FOREIGN PATENT DOCUMENTS

| | | |
|---|---|---|
| GB | 2308933 A | 7/1997 |
| GB | 2340686 A | 2/2000 |
| WO | WO 93/09503 | 5/1993 |
| WO | WO 02/15013 A3 | 2/2002 |

OTHER PUBLICATIONS

Lajeunesse, et al., "Interfacing the H17190 to a Microcontroller," INTERSIL, Application Note AN9527, Sep. 1995, pp. 1-5.

74VCX163245 Low Voltage 16-Bit Dual Supply Translating Transceiver with 3-STATE Outputs, Fairchild Semiconductor, Mar. 2002, pp. 1-9.

* cited by examiner

METHOD AND APPARATUS FOR BUFFERING BI-DIRECTIONAL OPEN DRAIN SIGNAL LINES

FIELD OF THE INVENTION

This invention relates to buffering integrated circuits, and more particularly, to buffering bi-directional signals for a voltage conversion such that components having different input/output voltages can communicate across a single bus.

BACKGROUND

Communication devices include components having different voltage requirements that interface with each other. For example, a radio can have several components (e.g., a memory, a transceiver) on an inter-integrated circuit ($I^2C$) serial bus and other components (e.g., a smart battery) on a system management bus (SMBUS). In theory, according to the technical specifications of these two buses, the buses should be able to interface directly with each other. In practice, however, this may not always be the case. The two buses (and thus the components thereon) often have different input and output voltages. An intermediate interface between the two buses is needed in order for the two sets of components to communicate with each other.

FIG. 1 illustrates a typical bi-directional buffer 100, which buffers data lines with a buffer integrated circuit (IC), such as, for example, 74VCX163245GX or an equivalent. A typical bi-directional buffer includes data ports 120 and 190, respectively, supplying Data A and Data B, bonding pads 130, 140, 180, uni-directional tri-stateable drivers 160, 170, and inverter 150. Buffer ICs of this type can control the data direction with an additional input pin T/R 110. The signal at input pin T/R 110 indicates to the circuit whether data is going from port 120 to port 190 or port 190 to port 120. Such a buffer IC is typically considered a good interface between a microprocessor bus and a memory bus.

Without a directional control signal, a drawback of using buffer ICs arises when either of the connected components can begin a data transfer based only on the presence or absence of activity on the data line. Without a directional control signal from the components, the direction of the data flow cannot be determined beforehand. This occurs when, for example, the drivers of the serial data lines are an inter-integrated circuit ($I^2C$) or a system management bus (SMBUS) devices. With these devices, there is no external control signal available to indicate the data direction for the bi-directional buffer 100. With no directional control signal, since data can travel both ways, it is possible for contention to occur along the data path, i.e., data from each direction conflicting on ports 120 or 190.

Another device considered for buffering input/output signals is a pass transistor. The pass transistor is configured to always be on and provide open collector buffering of two signals. FIG. 2 illustrates an example of a pass transistor circuit 200 implemented between two typical integrated circuit input/output ports, which provides the ability to interface signals with different voltage levels defined for logic 1 state, such as 3.3 v and 2.5 v. More particularly, the circuit 200 includes IC data IN 215, 255, IC data OUT 225, 245, IC tri-state control 210, 250, IC tri-state output buffers 220, 240 (an output from the component), bonding pads 224, 244, IC input buffers 222, 242 (an input to the component), pass transistor 230, and two pull-up resistors 231, 232. In the figure, the pass transistor 230 is disposed between a pair of integrated circuit (IC) input/output (I/O) pads having input buffers and tri-state output buffers connected back to front. The direction that the signal passes through the pass transistor 230 is determined by the tri-state control signals 210, 250. Each tri-state control signal 210, 250 forces its associated tri-state buffer to a high impedance state or to the operational state. The value of the pull-up resistors is determined by the voltage level and drive current requirements of the IC pins being buffered.

When the logic 1 voltage levels or output drive current requirements of the buffered signals are significantly different, one of the buffered devices becomes unable to achieve a voltage level low enough to be recognized as logic 0. Typically, for current CMOS devices, the highest voltage level guaranteed to be recognized as logic 0 is 30% of the full logic 1 level, or 0.99 v for 3.3 v logic or 0.75 v for 2.5 v logic. This reduces the noise margin for the logic 0. With the pass transistor always being on, the pull-up resistors required to pull the signal on each side of the pass transistor to logic 1 appear in parallel to the two output drivers. The effective apparent parallel combination of the two separate pull-up resistors causes the device with the output with the lower sink current capability to be unable to drive its output voltage level low enough to be recognized as logic 0. Increasing the value of the pull-up resistors increases the overall resistance, which assists the device in achieving a logic 0 output with the weaker output. However, the larger resistances cause the output of the second device to have an excessive rise time when it releases the signal to logic 1. Additionally, with independent tri-state control signals, both devices may attempt to drive the interface at the same time.

Currently, a significant amount of circuitry and processor memory space is used to interface these different components. Consequently, a method or interface for bi-directional buffering, which provides direction control without a separate control signal and the ability to buffer different input/output voltages from interfaced components across a signal bus, is desirable.

SUMMARY

An interface between components having different voltage requirements can increase the capabilities and reduce the size of communication devices by eliminating at least one component within the communication device. Less circuitry and less processor memory space are used when providing a single interface for the differing components. For example, in a radio, typically, some components (e.g., a memory, an audio circuit, a real time clock, or a potentiometer) are connected on an inter-integrated circuit ($I^2C$) serial bus and other components (e.g., a smart battery or a temperature sensor) are connected on a system management bus (SMBUS). Using the present invention, any or all of these components can be connected on a single bus that includes the bi-directional buffer of the present invention. The present invention allows components to interface with each other in spite of the input and output voltages. As a result, direction control without a separate control signal and the ability to buffer different input/output voltages from interfaced components across a single bus is possible.

More specifically, a Field Programmable Gate Array (FPGA) or an Application Specific Integrated Circuit (ASIC) can have a single input/output (I/O) pin for each bus, e.g., $I^2C$ or SMBUS, that interfaces with each of the interfaced components according to the present invention. Open drain data lines with different current sink specifications are buffered by tri-state control of the output buffer in an input/output pad of an integrated circuit. The tri-state control of the output buffer mimics an open drain signal by connecting the input port of the output buffer to logic 0 and connecting an active low digital control signal to the tri-state control port of the output buffer. When the active low digital control signal is logic 1, the output buffer is tri-stated and any external signal drives the node to either logic level. When the active low digital control signal is logic 0, the output buffer is enabled and drives the external node to logic 0.

The above and still further features of the present invention will become apparent upon consideration of the detailed description of specific embodiments thereof, particularly when taken in conjunction with the accompanying drawings wherein like reference numerals in the various figures are utilized to designate like components.

BRIEF DESCRIPTION OF THE FIGURES

The details of one or more embodiments are set forth in the accompanying drawings and the description below. Other features will be apparent from the description and drawings and from the claims.

DETAILED DESCRIPTION

An interface between components having different voltage requirements increases the capabilities and reduces the size of communication devices by using less circuitry and less processor memory space. Using the present invention, components having different signal levels can be connected on a single bus that includes the bi-directional buffer of the present invention. According to the present invention, components can interface with each other in spite of the input and output voltages. In particular, the buffer circuit translates, i.e., converts, a logic level 1 of a first component to a logic level 1 of a second component, where logic level 1 for each component is at a different voltage level.

In accordance with an exemplary embodiment, the present invention buffers signals between I²C bus and SMBUS components by translating, i.e., converting, a signal from one voltage level to another voltage level. As a result, each component operates in isolation from the other components and within its own electrical specifications without concern for the electrical specifications of the other components.

The present invention can be implemented in an integrated circuit (e.g., FPGA or ASIC) or with discrete components to buffer bi-directional serial data interfaces that have different voltage level and drive requirements. Such uses include logic level shifting when an FPGA includes programmable I/O voltage levels.

Figure 1:
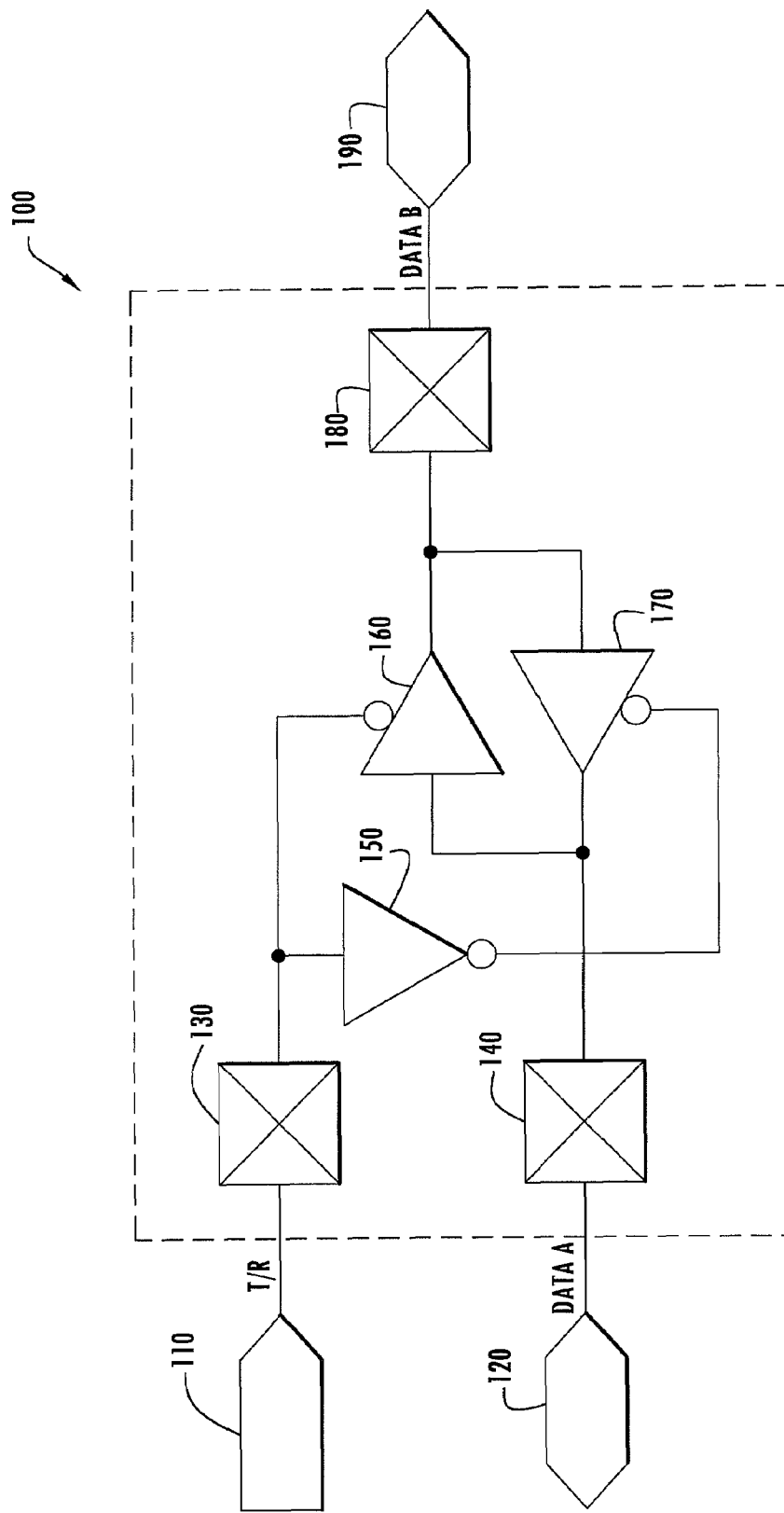
FIG. 1 illustrates a known bi-directional buffer.
Figure 2:
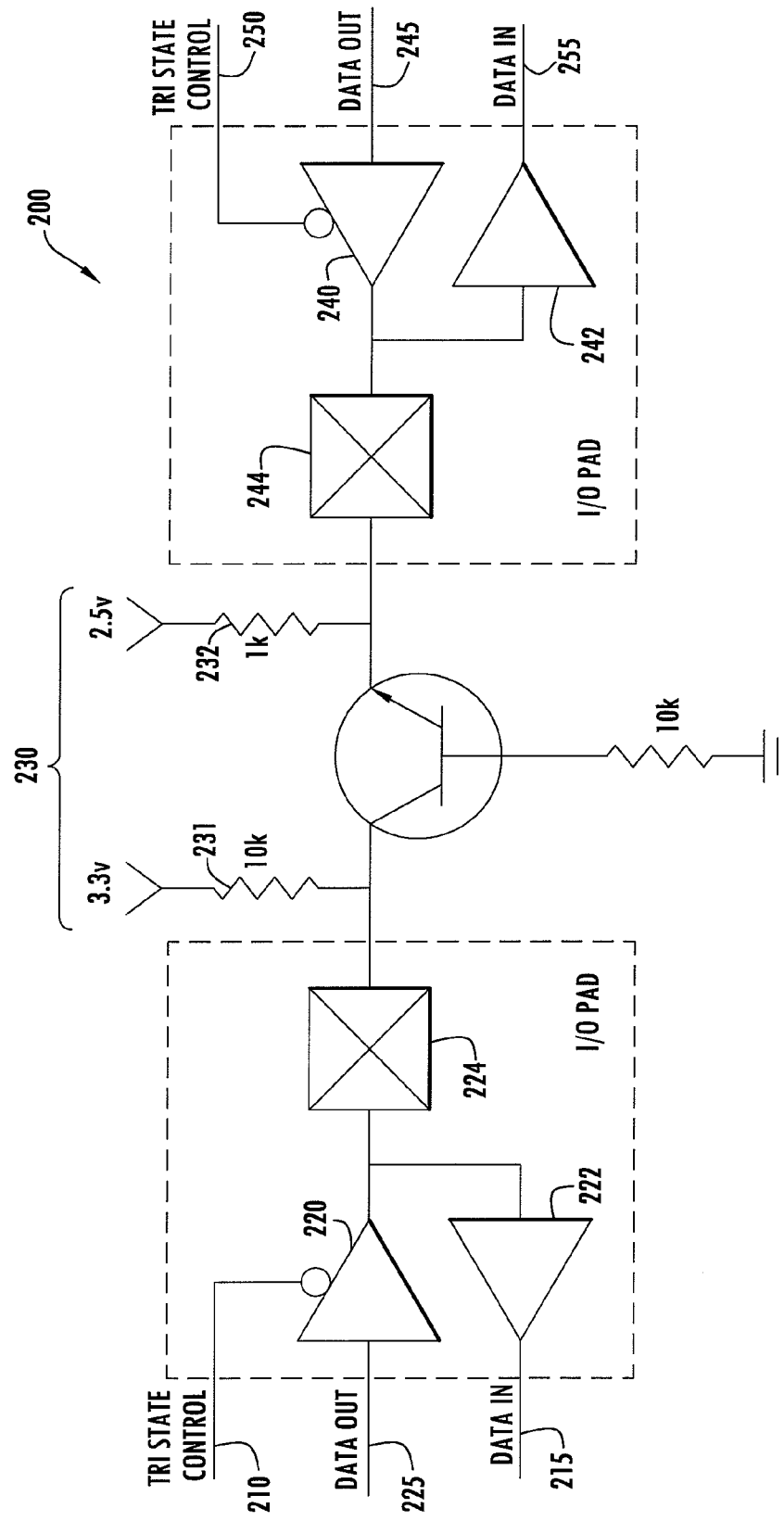
FIG. 2 illustrates a known pass transistor buffer circuit.
Figure 3:
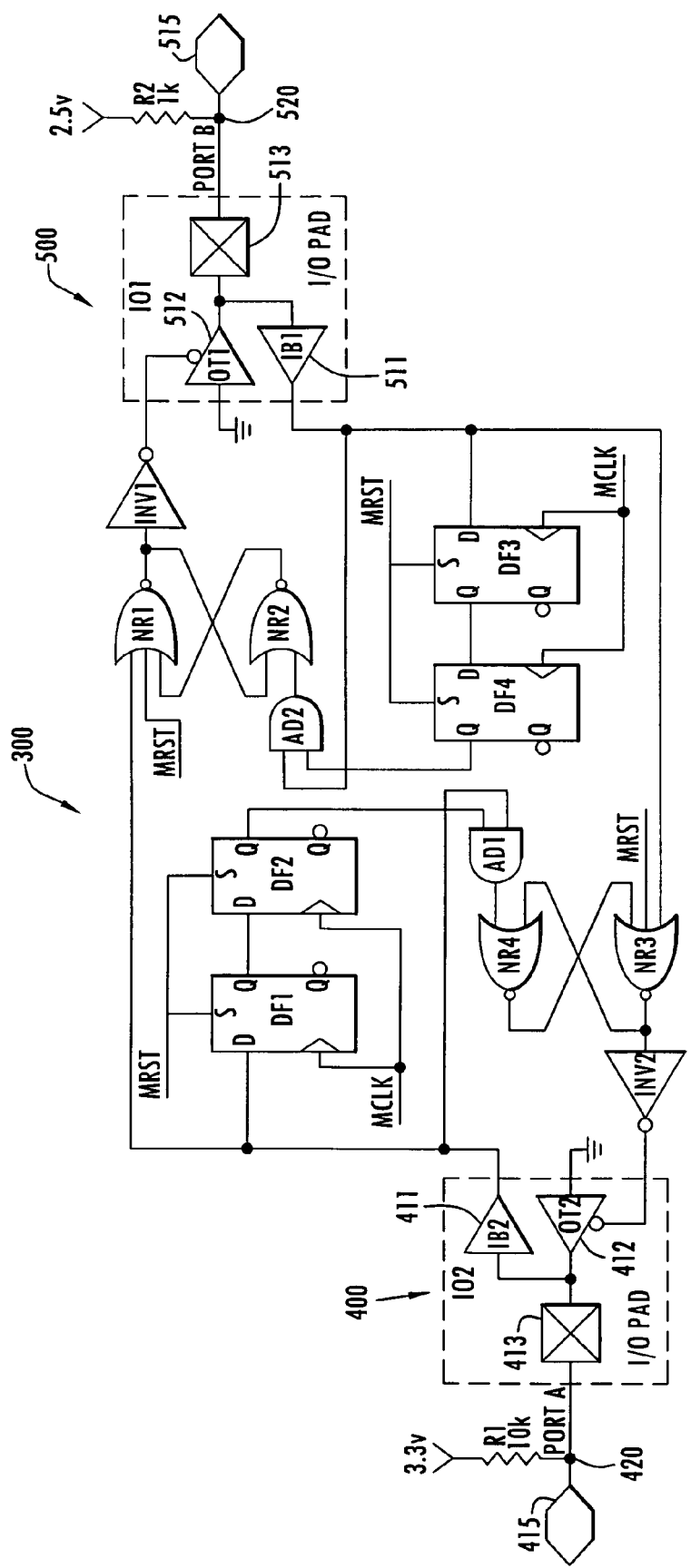
FIG. 3 is a schematic diagram of a bi-directional buffer according to the present invention.

Referring to FIG. 3, a bi-directional data buffer 300 has two input/output pads 400, 500 connected in a back-to-front fashion. In this example, the two input/output pads (I/O pads) 400, 500 are essentially mirror images of each other. Each I/O pads 400, 500 has the same components connected in an identical manner; only one I/O pad runs left to right (400) and the other runs right to left (500).

I/O pad 400 includes an input buffer 411, a tri-state output buffer 412, and a bonding pad 413. An input (output) signal 415 at a voltage level of 3.3V for logic 1 is input (output) at Port A 420. Likewise I/O pad 500 includes an input buffer 511, a tri-state output buffer 512, and a bonding pad 513. The input (output) signal 515 at a voltage level of 2.5V for logic 1 is input (output) at Port B 520.

The I/O pad 400, 500 functions like a conventional I/O pad to receive/transmit a signal coming into/leaving the buffer circuit. When a signal first enters the I/O pad 400, 500, the signal is input via the bonding pad 413, 513. Then, the signal is transmitted to the input buffer 411, 511, where it is transmitted into the rest of the components of the buffer circuit. When a signal is to be transmitted from the buffer circuit, the tri-state output buffer 412, 512 receives the output transmission from the buffer circuit and then transmits the output signal to the bonding pad 413, 513. After being received by the bonding pad 413, 513, the signal is then transmitted from the buffer circuit to the receiving component.

There is no directional control signal in the buffer circuit of the present invention. However, problematic issues, such as contention, do not plague operation of this buffer circuit although there is no directional signal. Directional control in the instant case is affected by the path along which data is sent through buffer. Direction is determined by which port (side) is sending data.

For simplicity, the following description focuses on the bi-directional buffer 300 as it flows from left to right in FIG. 3. This description also applies, however, to the bi-directional buffer 300 as it flows from right to left, when the appropriate component references are substituted, as the two paths are symmetrical.

The bi-directional buffer 300 also includes a master clock MCLK and a master reset MRST. The master clock MCLK controls the timing of signals through the buffer 300. The master reset MRST initializes the bi-directional buffer by asserting a signal to the D-type flip-flops (D FFs) at the S input and to an input of the respective cross-coupled NOR circuit (latch).

Between the two I/O pads 400, 500 of the bi-directional buffer 300 are a series of interconnected logic components. Described from left to right, the upper portion of the bi-directional buffer 300 includes two D-type flip-flops DF1, DF2, an AND gate AD2, two NOR gates NR1, NR2, and an inverter INV1. On the lower portion of the bi-directional buffer 300 likewise includes two D-type flip-flops DF3, DF4, an AND gate AD1, two NOR gates NR3, NR4, and an inverter INV2. Each D-type FF includes an input for a signal from the master clock MCLK, an input S for the signal from the master reset MRST 320, an data input D, and two outputs Q and $\overline{Q}$, which $\overline{Q}$ is the inverted value of Q.

In this exemplary configuration of the present invention, there are four D-type flip-flops (D FFs). The number of D FFs used in the synchronization paths (D1, D2 and D3, D4) of the circuit depends, for example, on the frequency of MCLK and the rise time of the external pull-up resistors R1, R2, not the data rate. By varying the number of D FFs in each synchronization path, a delay greater than the longer rise time of the two external pull-up resistors can be provided, as necessary. For example, the transition to logic 0 at signal 415 causes the cross-coupled NOR circuit (latch) NR4 and NR3 to block the logic 0 from completing the loop through I/O pad 500 and appearing at the input of INV2. When signal 415 transitions to logic 1, I/O pad 500 is still at logic 0 for a period slightly longer than the rise time of resistor R2 at Port B 520. The delay in DF1 and DF2 continues to block logic 0 from I/O pad 500 until I/O pad 500 has transitioned to logic 1. This delay prevents the circuit from locking up when logic 0 is applied at either input.

Slower (i.e., longer) rise times of the external pull-up resistors increase the required delay due to the D FFs. The required delay can be different for each rise time. If the required delays are different, the delay of D-type flip-flops DF1 and DF2 would be determined by the rise time of resistor R2 at Port B 520 and the delay of D-type flip-flops DF3 and DF4 would be determined by the rise time of resistor R1 at Port A 420. The delay can put a limit on the maximum data rate. However, rise times (delays) are typically less than 5% of the data bit time.

By design, the ratio of the master clock MCLK to the frequency of logic level transitions on the inputs of the buffer is, for example, at least 4:1. In practice, ratios of 20:1, 30:1, or higher are usually used. A minimum of two flip-flops in the delay chain are required to prevent meta-stability problems. A 2:1 clocking ratio causes the delay in the delay chain to equal between ½ and 1 full data bit period, depending on the timing between the data transition and the clock edge. This interferes with assertion of the acknowledgement (ACK) bit (driven by the receiving device) in the I²C protocol. Thus, using the 2:1 ratio for the clock signal causes missed clocks. A 4:1 ratio with a two Flip Flop delay chain creates a delay between ⅜ and ½ bit period. This allows assertion of the ACK bit halfway through the bit period, which meets the specification, but without any timing margin. Higher ratios provide more timing margin.

An exemplary circuit uses an MCLK frequency to data rate ratio of 128:1. A higher ratio of the master clock MCLK to the frequency of logic level transitions on the inputs of the buffer allows for higher resolution (smaller time increments), but an increased number of D-type flip-flops are required in the flip-flop delay chain. With higher resolution, the D-type flip-flop delay chain can more closely match the slowest rise time of the two external pull-up resistors.

Referring to FIG. 3, a description of the signal flow, from left to right, starting at Port A follows. A signal 415 is input at Port A, passes through bonding pad 413 to input buffer 411. Then, the signal is supplied as an input to NOR gate NR1, D-type flip-flop DF1, and AND gate AD1. The NOR gate NR1 also has the MRST signal and the output of NOR gate NR2 as inputs. The output of NOR gate NR1 is the input to inverter INV1 and an input to NOR gate NR2. NOR gate NR2 also has the output of AND gate AD2 as an input. (The inputs to AND gate AD2 are from the D-type flip-flop DF4 and the input buffer EB1 511 and are similar to the description, which follows below relating to the D-type flip-flops DF1, DF2 and input buffer EB2 411.) The output of the inverter INV1 is inverted as an input to output buffer OTI 512. The output from output buffer OTI 512 passes through bonding pad 513 to Port B to a component.

The D-type flip-flop DF1 receives the signal from buffer IB2 411 as an input at D and outputs the signal at Q to another D-type flip-flop DF2, which receives the signal at D and outputs the signal at Q. The signal output from D-type flip-flop DF2 is an input to AND gate AD1. The other input to AND gate AD1 (as noted above) is the signal from buffer IB2 411. The output from AND gate AD1 is an input to NOR gate NR4, which is an input to NOR gate NR3. NOR gate NR3 also has the master reset MRST signal and the output of buffer IB1 511 as inputs. The output of NOR gate NR3 is an input to NOR gate NR4 and an input to inverter INV2. The output of inverter INV2 is inverted as an input to output buffer OT2 412.

The following description describes the flow within the bi-directional buffer 300 from right to left in FIG. 3. As the two paths are symmetrical, the flow is a mirror image of the flow from left to right.

Referring to FIG. 3, a description of the signal flow, from right to left, starting at Port B follows. A signal 515 is input at Port B, passes through bonding pad 513 to buffer 511. Then, the signal is supplied as an input to NOR gate NR3, D-type flip-flop DF3, and AND gate AD2. The NOR gate NR3 also has the MRST signal and the output of NOR gate NR4 as inputs. The output of NOR gate NR3 is the input to inverter INV2 and an input to NOR gate NR4. NOR gate NR4 also has the output of AND gate AD1 as an input. (The inputs to AND gate AD1 are from the D-type flip-flop DF2 and the input buffer IB2 411 and are similar to the description, which follows below relating to the D-type flip-flops DF3, DF4 and input buffer EB1 511.) The output of the inverter INV2 is inverted as an input to output buffer OT2 412. The output from output buffer OT2 412 passes through bonding pad 413 to Port A to a component.

The D-type flip-flop DF3 receives the signal from buffer IB1 511 as an input at D and outputs the signal at Q to another D-type flip-flop DF4, which receives the signal at D and outputs the signal at Q. The signal output from D-type flip-flop DF4 is an input to AND gate AD2. The other input to AND gate AD2 (as noted above) is the signal from buffer EB1 511. The output from AND gate AD2 is an input to NOR gate NR2, which is an input to NOR gate NR1. NOR gate NR1 also has the master reset MRST signal and the output of buffer IB2 411 as inputs. The output of NOR gate NR1 is an input to NOR gate NR2 and an input to inverter INV1. The output of inverter INV1 is inverted as an input to output buffer OT1 512.

Figure 4:
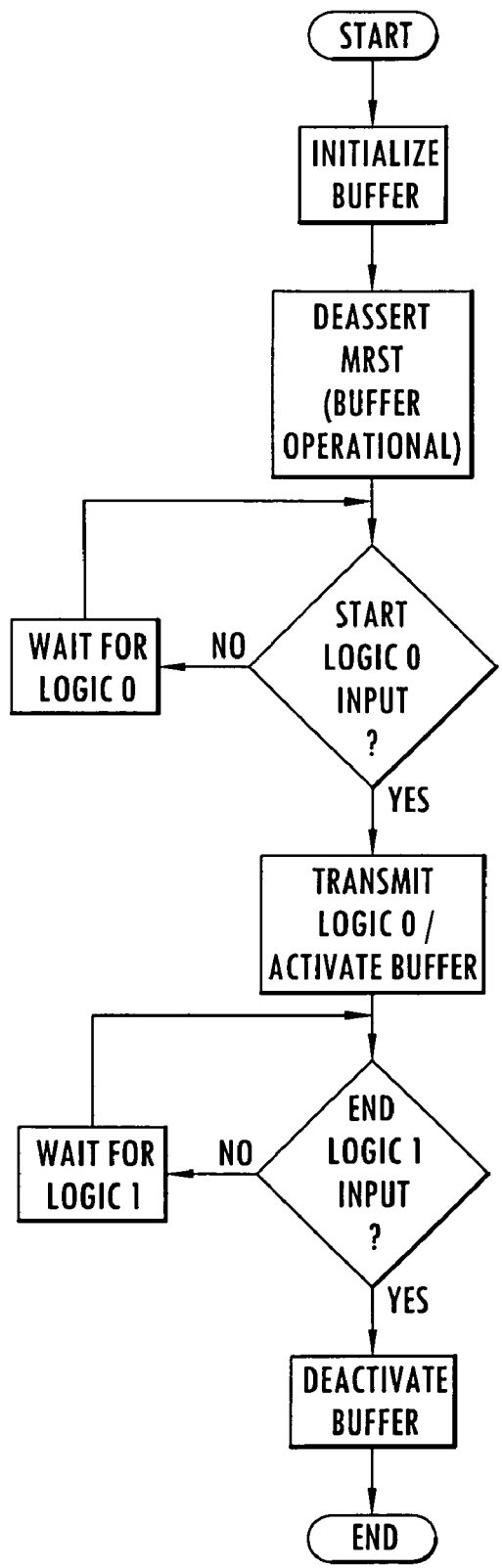
FIG. 4 is a flow chart illustrating a method of buffering a bi-directional integrated circuit according to the present invention.

Referring to FIG. 4, the flow chart illustrates the process of buffering bi-directional open drain circuits according to the present invention. Firstly, the buffer 300 is initialized. Initialization of the bi-directional buffer is achieved by powering on the buffer 300 and asserting the master reset MRST. Then, the master reset MRST is de-asserted so that the buffer 300 can operate. With an activated buffer 300, data is sent according to the bus protocol circuit. Upon completion of the data, the buffer 300 is then de-activated.

For example, following an I²C bus protocol, the buffer 300 would operate as follows. However, the buffer 300 is capable of passing data for any bi-directional serial data protocol that drives logic 0 and tri-states for logic 1, and is not limited to using the I²C bus protocol described. The bus protocol for sending data provides for a start bit and a stop bit. The start bit, which initiates the transfer of data, is typically a hi to lo (1→0) transition on the data line, with the clock (of the bus) at hi. One bit of data is sent during each cycle of the clock starting with a lo to hi (0→1) transition through a hi to lo (1→0) transition and ending at the next lo to hi (0→1) transition. MCLK is used to trigger clock of the bus. Internally, the flip-flops could trigger off a different edge of MCLK, where MCLK is implemented with a different polarity, i.e., 0→1 or hi. The buffer is toggled between active/non-active throughout the transfer of data. Finally, when the data transfer is completed, there is a stop bit and data returns to hi from lo (0→1), while the other control line is hi (at 1). Then the circuit is ready for the next data stream.

Once initialized, the system transfers data, i.e., a 10101010 bit stream, from component to component across the buffer circuit. For example, a data stream is sent from the input Port A 420 to output Port B 520 or in the reverse. Data is sent by the following process: With each 0 of the bit stream, the buffer circuit is activated (on) or with each 1 of the bit stream, the buffer circuit is de-activated (off). Thus, in essence, only logic "0"s are sent through the buffer circuit. For example, according to the I²C and SMBUS protocols, after 8 bits of data are transferred in one direction, the receiver transfers a single logic 0 on the next cycle of the clock to acknowledge correctly receiving the data. After the acknowledgement, the original data transmitter can send more data or execute a stop bit.

Based on the MCLK rate and the length of the flip-flop delay chain, at the end of each transmitted logic 0 (or more precisely described, the beginning of each transmitted logic 1), there is a brief period of time during which recognition of the new logic 0 is delayed. This "delay" is equivalent to the time measured by the flip-flop delay chain (the slowest pull-up resistor rise time). During this period, logic 0 cannot be transmitted. However, this inability to transmit a logic 0 is not significant as it is triggered by the upcoming transmission of a logic 1. If a logic 0 were to be transmitted, the above time period would not be triggered as the input is already at logic 0.

In operation, referring to FIGS. 3 and 4, each side of the bi-directional buffer 300, i.e., I/O pads 400, 500 and Ports A and B 420, 520, provides tri-state control through the connectivity/interaction of the various components. The bi-directional buffer 300 is first initialized by asserting master reset MRST, i.e., asserting logic 1. As a result, the output of NOR gate NR1 is logic 0, and causes inverter INV1 to drive logic 1 to the tri-state control of the output buffer OT1. Then Port B is tri-stated and allows the external pull-up resistor R2 to present logic 1 (2.5V) to the component.

Activation of MRST also initializes the outputs of D flip-flops DF3 and DF4 to logic 1 and causes the output of AND gate AD2 to drive logic 1. In turn, AND gate AD2 causes the output of NOR gate NR2 to drive logic 0. NOR gates NR1 and NR2 are connected in a cross-coupled fashion, which produces a latch, and each NOR gate has a single input held at logic 1 after initialization and the master reset MRST is de-asserted. After master reset MRST is de-asserted, i.e., logic 0, and the bi-directional buffer 300 is operational.

For exemplary purposes, activation of the bi-directional buffer 300 will be described in relation to logic 0 being externally driven on Port A. Alternatively, the bi-directional buffer 300 could be activated from a signal driven on Port B. Logic 0 is driven on Port A from a component attached to the bus (not shown). The signal passes through bonding pad 413 to an input buffer IB2 411. The buffer IB2 411 presents logic 0 to the input of NOR gate NR1. The inputs to NOR gate NR1 (from buffer EB2, MRST, and NOR gate NR2) are now logic 0 so the output of NOR gate NR1 transitions to logic 1. This logic 1 output is inverted by inverter INV1 and logic 0 is presented to the tri-state control input of output buffer OT1, which causes the output buffer OT1 to turn on and drive logic 0 through bonding pad 513 on Port B. The logic 1 output of NOR gate NR1 is also input to NOR gate NR2. There is no immediate effect because the other input to NOR gate NR2 is driven to logic 1 by the output of AND gate AD2.

The logic 0 from buffer 411 is also an input to AND gate AD1, which causes the output of AND gate AD1 to transition to logic 0. The output of AND gate AD1 is input to NOR gate NR4. Logic 0 on both inputs to NOR gate NR4 causes the output of NOR gate NR4 to transition to logic 1. The logic 1 output from NOR gate NR4 is input to NOR gate NR3 before the transition to logic 0 of the input from EB1 due to propagation delays through NOR gate NR1, inverter INV1, output buffer OT1, and input buffer IB1. Therefore, no change in the output of NOR gate NR3 is observed and NOR gate NR3 continues to drive logic 0. The transition of NR4 to logic 1 "Breaks" the loop through the buffer circuit 300 and prevents the buffer 300 from locking up when a logic 0 is first presented at Port A 420. Likewise, NR2 provides a similar function when logic 0 is first presented at Port B 520.

Also, the logic 0 from buffer 411 is presented to the D input of D-type flip-flop DF1. This occurs at the same time as the logic 0 is input to AND gate AD1. D-type flip-flops DF1 and DF2 synchronize the logic 0 from buffer 411 to the internal master clock MCLK, which provides a delayed version of the logic 0 from buffer 411 to AND gate AD1. After two clock edges of the internal master clock MCLK, both inputs to AND gate AD1 are logic 0.

The logic 0 output signal from output buffer OT1 is driven back into the bi-directional buffer 300 from Port B via input buffer IB1. This logic 0 is an input to NOR gate NR3, AND gate AD2, and D-type flip-flop DF3. In this case, the logic 0 has no effect on the output logic level of NOR gate NR3 because the output of NOR gate NR4 that was previously driven to logic 1 maintains the output of NOR gate NR3 at logic 0. The logic 0 input from input buffer IB1 also causes the output of AND gate AD2 to transition to logic 0, which provides a logic 0 to the input of NOR gate NR2. In this case, there is no effect on the bi-directional buffer 300 because the output of NOR gate NR1 that was previously driven to logic 1 maintains the output of NOR gate NR2 at logic 0. The logic 0 is synchronized to internal master clock MCLK in D-type flip-flops DF3 and DF4. The transition of the output of D-type flip-flop DF4 to logic 0 has no effect on the bi-directional buffer 300 because the output of AND gate AD2 is already driven to logic 0 from input buffer EB1, as discussed above.

To deactivate the circuit, an external source (not shown) driving logic 0 on Port A releases the node. This allows pull-up resistor R1 to pull the node to logic 1. This causes input buffer EB2 to present logic 1 to the input of NOR gate NR1 and cause the output of NOR gate NR1 to transition to logic 0. This logic 0 is inverted by inverter INV1 and logic 1 is presented to the tri-state control input of output buffer OT1, which causes the output buffer OT1 to turn off and allows pull-up resistor R2 to pull Port B to logic 1. The output logic 0 of NOR gate NR1 is input to NOR gate NR2. This causes the output of NOR gate NR2 to transition to logic 1. The output transition to logic 1 of NOR gate NR2 has no effect on NOR gate NR1 because the input of NOR gate NR1 driven by input buffer IB2 is also logic 1.

The transition to logic 1 of Port A is an input to AND gate AD1, which has no immediate effect. Also, the input logic 1 is presented to the D input of D-type flip-flop DF1. This occurs at the same time as logic 1 is presented to the AND gate AD1. D-type flip-flops DF1 and DF2 synchronize the input logic 1 to the internal master clock, MCLK, which provides a delayed version of the input signal to AND gate AD1. After two edges of the internal master clock MCLK, both inputs of AND gate AD1 are logic 1. This causes the output of NOR gate NR4 to transition to logic 0, and allows the output of input buffer EB1 to control the output of NOR gate NR3.

The pulling of Port B to logic 1 appears at the output of input buffer IB1. The logic 1 output by buffer IB1 is an input to NOR gate NR3. The output of NOR gate NR3 does not change because the input driven from NOR gate NR4 is logic 1 due to the synchronization delay in D-type flip-flops DF1 and DF2.

The transition to logic 1 of Port B is an input to AND gate AD2, which has no immediate effect because the other input of AND gate AD2 is logic 0 by the output Q of DF4. Also, the input logic 1 is presented to the D input of D-type flip-flop DF3. This happens at the same time as logic 1 is presented to AND gate AD2. D-type flip-flops DF3 and DF4 synchronize the input logic 1 to the internal master clock, MCLK, which provides a delayed version of the input signal to AND gate AD2. After two cycles of the internal master clock MCLK, the output Q of DF4 transitions to logic 1. Both inputs of AND gate AD2 are logic 1, which causes the output of AND gate AD2 to transition to logic 1. The transition of the output of AND gate AD2 to logic 1 is an input to NOR gate NR2. The output of NOR gate NR2 transitions to logic 0, which allows the output of input buffer IB1 to control the output of NOR gate NR3.

While the exemplary architecture has been described in relation to activation from Port A, alternately, the buffer can be activated from either Port A or Port B. Further, the bi-directional buffer may be implemented solely as software as well as a combination of both software and hardware, or even as hardware alone. The above description is not meant to limit the bi-directional buffer to a particular design, as many variations are possible and within the scope of the description provided thus far.

The present invention may include any quantity of conventional or other components having predetermined logic voltage requirements. The present invention may employ any conventional access scheme or protocol to initially access and/or transmit information. The present invention may be in the form of any type of radio unit, communications device, or other electronics device.

The bi-directional buffer of the present invention may be implemented by any conventional or other microprocessor, controller or circuitry to perform the functions described herein, while any quantity of processors or processing devices or circuitry may be employed within the present invention where the processor functions may be distributed in any fashion among any quantity of hardware and/or software modules, processors or other processing devices or circuits. The software of the present invention may be implemented in any suitable computer language, and could be developed by one of ordinary skill in the computer and/or programming arts based on the functional description contained herein and illustrated in the drawings. Further, any references herein of software performing various functions generally refer to processors performing those functions under software control. The software, functions, and/or algorithms described above and illustrated may be modified in any manner that accomplishes the functions described herein.

It is to be understood that the present invention is not limited to the applications or designs described herein.

While the invention has been described in detail and with reference to specific embodiments thereof, it will be apparent to one skilled in the art that various changes and modifications can be made therein without departing from the spirit and scope thereof. For example, some or all of the subject matter may be embodied as software, hardware or a combination thereof. Accordingly, it is intended that the present invention covers the modifications and variations of this invention provided they come within the scope of the appended claims and their equivalents.

What is claimed:

1. A buffering apparatus, comprising:
    a first interface for receiving/transmitting a first input/output from/to a first component having a first predetermined set of logic voltage levels;
    a second interface for receiving/transmitting a second input/output from/to a second component having a first predetermined set of logic voltage levels;
    a buffering system disposed between the first and second interfaces, the buffering system being clocked by a clock signal and comprising first and second synchronization paths connected to the first and second interfaces, respectively, and first and second sets of cross-coupled NOR gates connected to the first and second interfaces, respectively, wherein each of the first and second synchronization paths comprises a plurality of flip-flops connected in series and clocked by the clock signal, and wherein a number of flip-flops in the first and second synchronization paths is determined by a ratio of a frequency of the clock signal to a frequency of transitions between logic voltage levels at the first interface or second interface.

2. The apparatus as claimed in claim 1, wherein the buffering system includes a first and a second input/output circuit, and a voltage adjusting circuit.

3. The apparatus as claimed in claim 1, wherein the first and second interfaces comprise first and second pull-up resistors, respectively.

4. The apparatus as claimed in claim 1, wherein each of the first and second interfaces comprises an input/output circuit that includes an input buffer, a tri-state output buffer, and a bonding pad, and wherein the input/output circuits of the first and second interfaces are configured as mirror images of each other.

5. A circuit arrangement, comprising:
    a first input/output circuit, the first input/output circuit including a first I/O pad with a first bonding pad, a first input buffer, and a first output buffer;
    a first delay circuit, the first delay circuit including a first set of at least two flip-flops and a first set of cross-coupled NOR gates;
    a second delay circuit, the second delay circuit including a second set of at least two flip-flops and a second set of cross-coupled NOR gates; and
    a second input/output circuit, the second input/output circuit including a second I/O pad with a second bonding pad, a second input buffer, and a second output buffer.

6. The apparatus of claim 3, wherein each of the first and second pull-up resistors has a rinse time, and wherein the number of flip-flops in the first and second synchronization paths further depends on the rise time of the first and second pull-up resistors.

7. The apparatus of claim 6, wherein the number of flip-flops in the first synchronization path depends on the rise time of the second pull-up resistor and the number of flip-flops in the second synchronization path depends on the rise time of the first pull-up resistor.

8. The apparatus of claim 6, wherein a ratio of the frequency of the clock signal to a frequency of logic level transitions and accordingly the number of flip-flops in the first and second synchronization paths determines an ability to match a slowest time of the first and second pull-up resistors.

9. A bi-directional buffer device, comprising:
a first input/output circuit for connection to a first component having a first set of logic voltage levels;
a second input/output circuit for connection to a second component having a second set of logic levels;
wherein the first input/output circuit and the second input/output circuit comprise components that are connected in mirror image configurations of each other;
a buffer circuit connected between the first input/output circuit and the second input/output circuit, wherein the buffer circuit comprises a first delay circuit comprising a first set of at least two flip-flops and a set of cross-coupled NOR gates and a second delay circuit comprising a second set of at least two flip-flops and a set of cross-coupled NOR gates.

10. The device of claim 9, wherein the flip-flops in the first and second delay circuit are clocked by a clock signal, and wherein a number of flip-flops in the first and first delay circuit and in second delay circuits is determined by a ratio of a frequency of the clock signal to a frequency of transitions between logic voltage levels at the first or second input/output circuit.

11. The device of claim 10, and further comprising a first pull-up resistor connected to the first input/output circuit and a second pull-up resistor connected to the second input/output circuit.

12. The device of claim 11, wherein each of the first and second pull-up resistors has a rise time, and wherein the number of flip-flops in the first and second delay circuits further depends on the rise time of the first and second pull-up resistors.

13. The device of claim 12, wherein the number of flip-flops in the first delay circuit depends on the rise time of the second pull-up resistor and the number of flip-flops in the second delay circuit depends on the rise time of the first pull-up resistor.

* * * * *

UNITED STATES PATENT AND TRADEMARK OFFICE
CERTIFICATE OF CORRECTION

PATENT NO. : 7,292,067 B2  
APPLICATION NO. : 11/128424  
DATED : November 6, 2007  
INVENTOR(S) : Daniel J. Schwarz Page 1 of 1

It is certified that error appears in the above-identified patent and that said Letters Patent is hereby corrected as shown below:

| | |
|---|---|
| Col. 5, l. 49: | "EB1" should read --IB1-- |
| Col. 5, l. 51: | "EB2" should read --IB2-- |
| Col. 5, l. 53: | "OTI" should read --OT1-- (occurs twice) |
| Col. 6, l. 17: | "EB1" should read --IB1-- |
| Col. 6, l. 27: | "EB1" should read --IB1-- |
| Col. 7, l. 51: | "EB2" should read --IB2-- |
| Col. 7, l. 67: | "EB1" should read --IB1-- |
| Col. 8, l. 36: | "EB1" should read --IB1-- |
| Col. 8, l. 42: | "EB2" should read --IB2-- |
| Col. 8, l. 63: | "EB1" should read --IB1-- |
| Col. 10, l. 52: | "rinse" should read --rise-- |
| Col. 11, ll. 17-18: | "in the first and first delay circuit and in second delay circuits" should read --in the first delay circuit and in the second delay circuits" |

Signed and Sealed this

Twenty-ninth Day of April, 2008

JON W. DUDAS  
*Director of the United States Patent and Trademark Office*